United States Patent [19]
Roques et al.

[11] Patent Number: 5,151,669
[45] Date of Patent: Sep. 29, 1992

[54] DUAL-GATE FET ATTENUATOR CONTROLLED BY A VARIABLE LOAD CIRCUIT

[75] Inventors: Daniel Roques; Michel Pouysegur; Jean-Louis Cazaux, all of Toulouse, France

[73] Assignee: Alcatel Espace, France

[21] Appl. No.: 586,113

[22] Filed: Sep. 21, 1990

[30] Foreign Application Priority Data

Sep. 26, 1989 [FR] France .................. 89 12587

[51] Int. Cl.⁵ .............................. H03H 11/24
[52] U.S. Cl. .................. 333/81 R; 307/568
[58] Field of Search .......... 333/81 R, 81 A; 307/540, 567, 568, 564, 560, 554

[56] References Cited

U.S. PATENT DOCUMENTS

| | | | |
|---|---|---|---|
| 3,748,495 | 7/1973 | Messinger | 307/568 X |
| 4,162,412 | 7/1979 | Mawhinney et al. | 307/554 |
| 4,700,153 | 10/1987 | Salvage et al. | 333/81 R |
| 4,806,888 | 2/1989 | Salvage et al. | 333/81 R X |
| 4,890,077 | 12/1989 | Sun | 333/81 A |
| 4,918,401 | 4/1990 | Langer | 333/81 R X |

FOREIGN PATENT DOCUMENTS

0272106 6/1988 European Pat. Off. .

OTHER PUBLICATIONS

GaAs IC Symposium, Technical Digest 1987, Portland, Ore., Oct. 13-16, 1987, pp. 235-238, IEEE, New York, US; R. J. Naster et al.: "An L-Band Variable-Gain Amplifier GaAs MMIC with Precise Binary Step Control".

1988 IEEE MTT International Microwave Symposium Digest, New York, May 25-27, 1988, vol. 1, pp. 171-174, IEEE New York, US; R. B. Culbertson et al.: "A 3-Watt X-Band Monolithic Variable Gain Amplifier".

Primary Examiner—Eugene R. LaRoche
Assistant Examiner—Benny Lee
Attorney, Agent, or Firm—Sughrue, Mion, Zinn, Macpeak & Seas

[57] ABSTRACT

A dual-gate field effect transistor attenuator wherein a variable active load (1) is applied to the second gate of the dual-gate field effect transistor (T1). The attenuator is particularly suitable for space telecommunications.

5 Claims, 2 Drawing Sheets

DUAL-GATE FET ATTENUATOR CONTROLLED BY A VARIABLE LOAD CIRCUIT

The invention relates to an attenuator using a dual-gate field effect transistor (FET).

BACKGROUND OF THE INVENTION

There are several techniques for making attenuators on GaAs, in particularly using monolithic microwave integrated circuit (MMIC) technology. The two main techniques use dual-gate FETs or single-gate FETs biased to have zero drain-source voltage (Vds=0).

PIN diode attenuators made using hybrid technology are not easily transposable to monolithic technology because of the difficulty of making PIN diodes on a GaAs substrate.

Attenuators based on single-gate FETs biased to have Vds=0 and as described in the literature do not provide very good performance with respect to insertion phase variation as a function of attenuation range.

However, tests have already been performed on dual-gate FET attenuators in attempts at achieving the desired objective. Most recent work relates to segmented dual-gate FET attenuators as described in the following two articles:

"A Microwave Phase and Gain Controller With Segmented Dual-Gate MESFETs in GaAs MMIC" by Y. C. Hwang, D. Temme, Y. K. Chen, and R. J. Naster (IEEE—Microwave and mm-Wave Monolithic Circuits Symposium—May 1984, pp. 1-5) describes a novel circuit constituted by a plurality of dual-gate FETs providing accurate gain control over a wide microwave band by virtue of an appropriate choice of gate width ratio: this accurate microwave gain control circuit has potential applications as an ultra wideband microwave attenuator or as an active microwave phase shifter.

"Segmented Dual-Gate MESFETs For Variable Gain and Power Amplifiers in GaAs MMIC" by K. H. Snow, J. J. Komiak, and D. A. Bates (IEEE—Trans. on MTT, vol. MTT-36, No. 12, December 1988, pp. 1976-1985) describes variable power and variable gain GaAs MMIC amplifier circuits using a dual-gate FET circuit.

These articles relate to digital attenuators constituted by a plurality of dual-gate FETs, each FET representing one bit. The insertion phase varies between 6° and 10° over an attenuation range of 20 dB depending on the frequency band. The principle used consists in minimizing insertion phase variation by individually optimizing the loads applied to the second gates of the dual-gate FETs constituting the various bits. The loads used are simple capacitances with different values from one bit to another. However, inlet and outlet reflection losses are not better than 6 dB because of the difficulty of matching the series of dual-gate FETs over the set of possible logic states.

The essential object of the invention is to provide such an attenuator while minimizing insertion phase variation as a function of attenuation.

SUMMARY OF THE INVENTION

To this end, the invention provides a dual-gate field effect transistor attenuator with a variable active load being applied to the second gate of the dual-gate field effect transistor.

Advantageously, this load is itself constituted by a single-gate field effect transistor biased to have zero drain-source voltage.

Compared with prior art devices, such as attenuator has the following advantages:

lower insertion phase variation over an attenuation range of 20 dB;

greatly improved return losses over the entire attenuation range (19 dB instead of 6 dB to 12 dB);

reduced power consumption (1 dual-gate FET instead of 6);

the circuit is simpler, thus improving manufacturing yield; and a continuous range of attenuation values is provided instead of a series of discrete values.

BRIEF DESCRIPTION OF THE DRAWINGS

Embodiments of the invention are described by way of example with reference to the accompanying drawings, in which.

DETAILED DESCRIPTION

The object of the attenuator of the invention is to minimize variation in insertion phase as a function of attenuation. In theory it is equally applicable to hybrid technology and to monolithic technology on GaAs, however it appears to be much easier to implement (and gives better results) using MMIC technology on GaAs. This technology is thus described by way of preferred example.

The attenuator circuit of the invention uses only one dual-gate FET T1 having an optimal load applied to its second gate, thereby simultaneously achieving flatness and attenuation range targets while also minimizing variation in insertion phase as a function of attenuation.

The desired targets of flatness and range can be achieved over bandwidths approaching 1 octave using passive loads that are relatively simple, e.g. just one capacitor. However such passive loads do not enable insertion phase to be kept constant over a large attenuation range. This phase variation may be as much as 20° or 30° over attenuation ranges of about 20 dB. Such performance is unsatisfactory in beam-forming array applications for active antennas where desired maximum variations are no more than 4° to 5° over a 20 dB range.

The principle of the invention consists in using a variable active load as a replacement for the passive load. If the point representing the load applied to the secong gate on a Smith chart is displaced, no significant variation in insertion phase is observed so long as the point remains within that half of the chart which is close to short circuit. In contrast, when approaching open circuit, the absolute phase of high attenuation states is subjected to very large variations to the extent of coming close to the phase of low attenuation states for which, on the contrary, the point is relatively distant from open circuit.

The invention thus consists in using a variable load 1 having the following characteristics:

finite value impedance that increases over a large portion of the attenuation range (which is not very sensitive to the value of the load so long as it is far from short circuit); and very large value impedance (nearly open circuit) for high values of attenuation.

Figure 1:
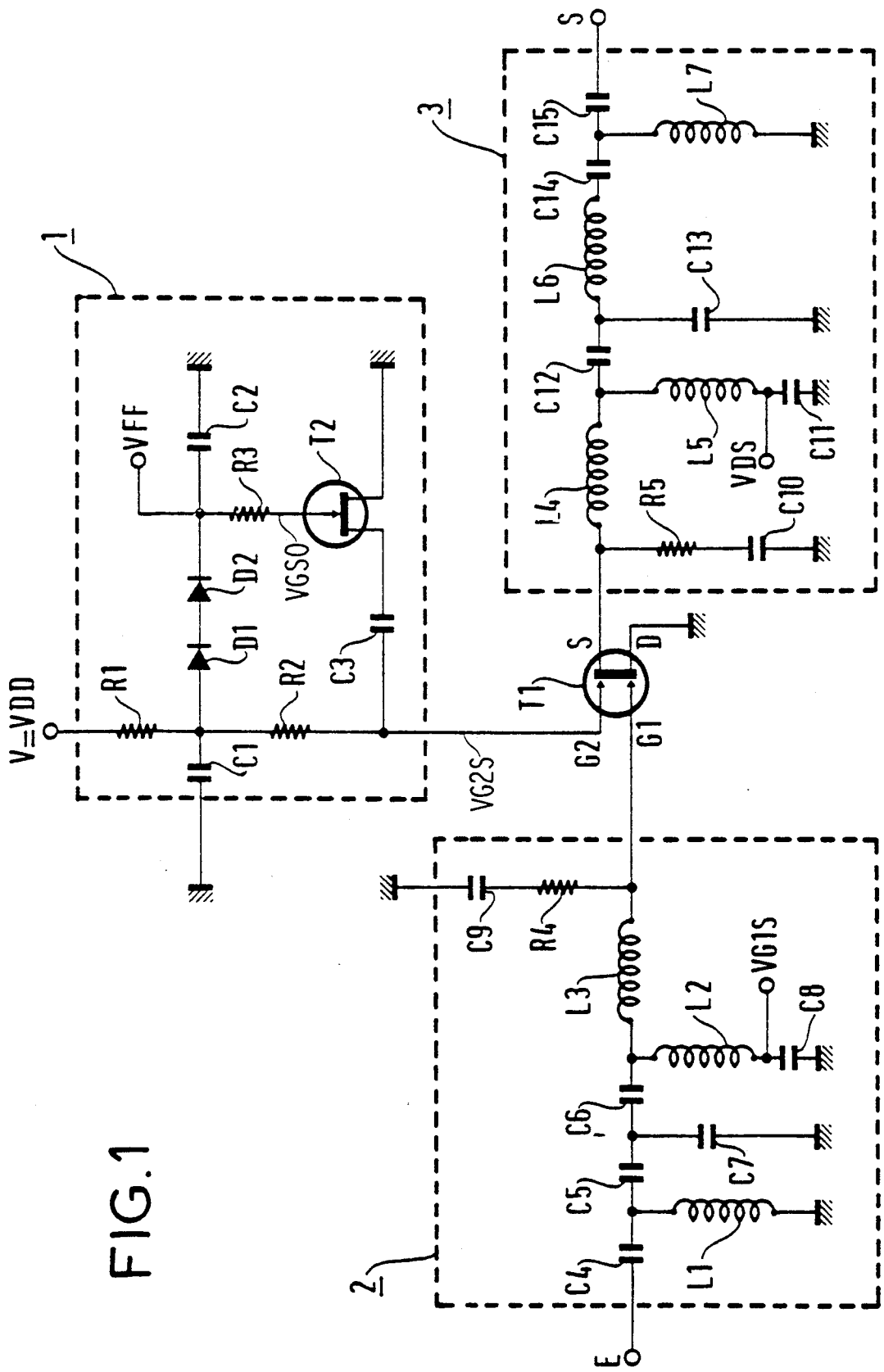
FIG. 1 is a circuit diagram of an attenuator of the invention.

In the preferred embodiment illustrated in FIG. 1, the variable load 1 is formed by capacitors C1, C2 and C3, resistors R1, R2 and R3, diodes D1 and D2 and an FET T2, all connected in the manner shown. In FIG. 1, VDD and VFF are supply voltage designations.

An FET T2 biased to have Vds=0 (a "cold" FET) satisfies the above-specified conditions. It behaves like a variable resistance (ignoring the capacitances Cgs, Cgd, and Cds) having a value that increases from a few Ω at Vgs=0 to several kΩ close to pinch-off, where access to an ideal short circuit is limited solely by low value parasitic capacitances. The terms $V_{gs}$ (gate-to-source voltage), $V_{ds}$ (drain-to-source voltage), $C_{gs}$ (gate-to-source capacitance), $C_{gd}$ (gate-to-drain capacitance) and $C_{ds}$ (drain-to-source capacitance) are all well-understood in the art and are not labelled in the drawings, for the sake of simplicity.

It is thus possible to sweep over the attenuation range by simultaneously varying the voltage VG2S applied to the second gate G2 of the dual-gate FET and varying the load applied to the same second gate G2. The transistor T2, i.e. the "cold" FET, constitutes this load and its value is a function of the voltage Vgso applied to its gate.

This results in substantially zero variation in the insertion phase over a large attenuation range.

A controllable attenuator made in MMIC technology on GaAs and operating in the 3-5 GHz band has been developed using commercially available FETs (dual-gate T1 and "cold" T2). The width W of the grid of the "cold" FET T2 was optimized to achieve minimum phase shift over as large an attenuation range as possible.

A capacitor C3 connected between the second gate G2 and the drain of the "cold" FET T2 decouples their respective biases.

This capacitor has substantially no effect on the resulting performance.

The second gate G2 of the dual-gate FET T1 and the gate of the "cold" FET T2 are biased via high value resistors R2 and R3 so as to separate the microwave signals from the bias.

However, when the bias voltage (VG2S) applied to the second gate of the dual-gate FET T1 varies from +1 V to −0.5 V, the bias voltage (VGSO) applied to the gate of the "cold" FET T2 must vary from −0.5 V to −2 V. A constant potential difference of 1.5 V must therefore be maintained between these two voltages. A single control can be used for generating both voltages VG2S and VGSO simultaneously. This is done using two FETs connected as diodes D1 and D2 and biased to the bend in their current-voltage characteristic (VGS=+0.75 V). Connecting them in series gives a potential across their terminals of 1.5 volts.

The circuits 2 and 3 are inlet and outlet matching networks built up from lumped components (inductors and capacitors). In the preferred embodiment illustrated in FIG. 1, the input gain matching network 2 is formed of capacitors C4-C9, inductors L1-L3 and resistor R4, all connected in the manner shown. VG1S is the bias voltage to be applied to the first gate G1 of the dual-gate FET T1. The input gain matching network matches the input line E to the input impedance of the dual-gate FET T1.

In the preferred embodiment illustrated in FIG. 1, the output gain matching network 3 is formed of capacitors C10-C15, inductors L4-L7 and resistor R5, all connected in the manner shown. VDS is the bias voltage to be applied to the source S of the dual-gate FET T1, whose drain D is grounded. The output gain matching network matches the output impedance of the dual-gate FET T1 to the output line S.

Such impedance transforming circuits are known to the person skilled in the art.

Figure 2:
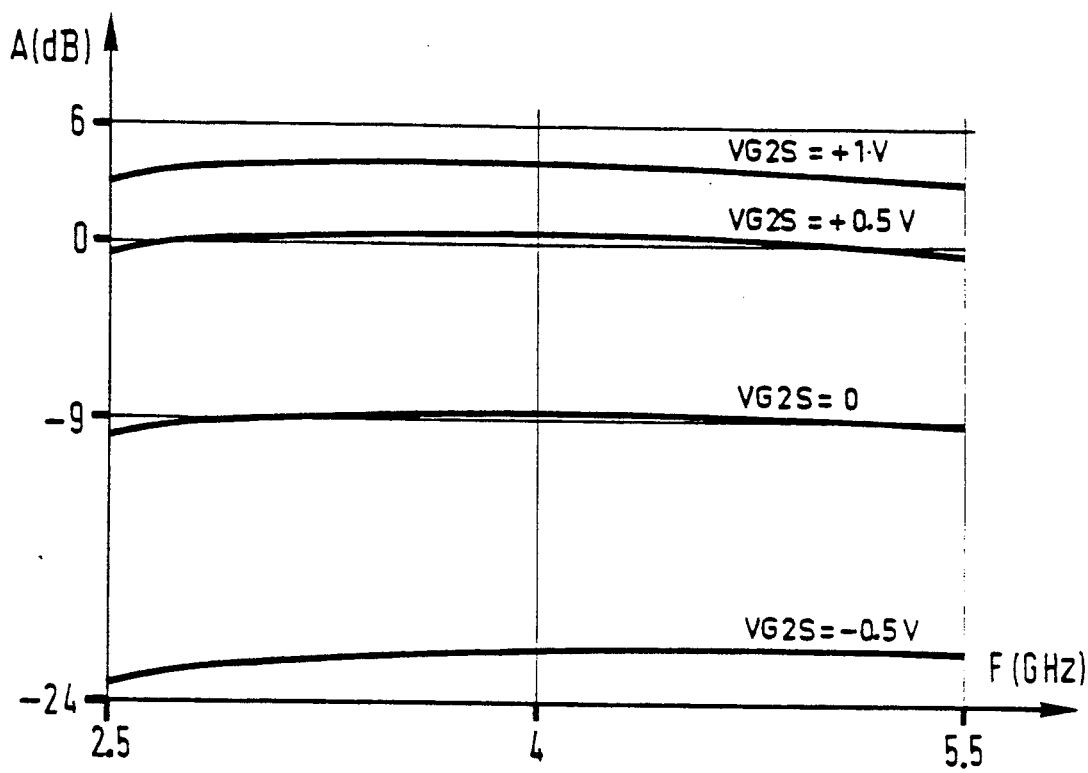
FIGS. 2 and 3 are two characteristic curves of the FIG. 1 attenuator.

The curves shown in FIG. 2 are curves showing attenuation A in dB as a function of frequency F in GHz for different values of VG2S: namely +1 volt; +0.5 volts; 0 volts; and −0.5 volts.

Figure 3:
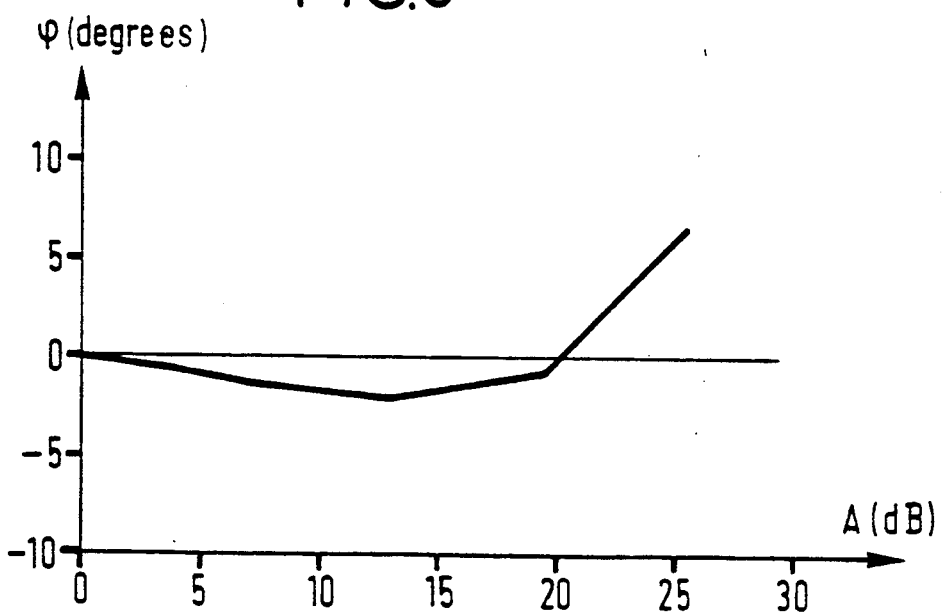

The curve shown in FIG. 3 is a curve showing phase 6 in degrees as a function of attenuation A in dB at a frequency F=4 GHz.

By way of numerical example, the curve shown in FIG. 3 was obtained using components having the following values:

Variable Load Circuit

C1 = 10 pF
C2 = 10 pF
C3 = 1 pF
R1 = 2.25 kΩ
R2 = R3 = 10 kΩ

Input Matching Network

C4 = 2 pf
C5 = 1.5 pF
C6 = 1.6 pF
C7 = 0.4 pF
C8 = 10 pF
C9 = 0.6 pF
R4 = 215 Ω
L1 = 2 nH
L2 = 2.8 nH
L3 = 4 nH

Output Matching Network

C10 = 0.5 pF
C11 = 10 pF
C12 = 0.8 pF
C13 = 0.2 pF
C14 = 2.6 pF
C15 = 2.2 pF
R5 = 215 Ω
L4 = 3.2 nH
L5 = 4.2 nH
L6 = 1 nH
L7 = 2.4 nH

Dual-Gate FET

L = 0.5 μm
W = 150 μm

Single Gate FET ("Cold" FET)

L = 0.5 μm
W = 37.5 μm

In the above list of component values, L and W represent the length and width, respectively, of the gates of the respective FETs.

The invention is particularly applicable to active antennas including an array of sources associated with an electronically controlled beam-forming network (BFN) in which beam pointing is related to phase, so that attenuation must be independent both of phase and of frequency.

Hundreds of attenuator units of this type are thus used in the beam-forming networks of active antennas. They are required to implement a desired amplitude law without disturbing the phase law as generated independently by a network of phase shifters. That is why variation in insertion phase for these attenuators must remain very low over the entire attenuation range.

The following performance characteristics have been obtained:

passband: 2.75 GHz to 5.25 GHz;

return losses at the accesses: better than 19 dB regardless of attenuation attenuation range 25 dB;

variation in insertion phase: $\leq 2°$ over a 20 dB range; and attenuation flatness over the band regardless of attenuation: $\pm 0.3$ dB.

The present invention has naturally been described and shown merely by way of preferred example, and its component parts could be replaced by equivalent parts without thereby going beyond the scope of the invention.

The invention may thus also be applied to an amplifier of a gain control channel.

We claim:

1. A dual-gate field effect transistor (FET) attenuator, comprising:

a dual-gate FET having first and second gates and having a source and drain; and a variable load comprising a single-gate FET having a gate, source, and drain, and a source-drain current path coupled between the second gate of the dual gate FET and a reference potential; and bias means coupled to said gate of said single-gate FET for applying a substantially zero drain-source bias voltage to said single-gate FET.

2. An attenuator according to claim 1, wherein said load has an impedance value which is a function of a gate-source voltage as further applied by said bias means to the gate of said single-gate FET.

3. An attenuator according to claim 2, further comprising an input matching network coupled to the first gate of said dual-gate FET and an output matching network coupled to one of the source and drain of said dual-gate FET.

4. An attenuator according to claim 3, wherein said attenuator has a variable attenuation value which is a function of the voltage across said second gate and source of said dual gate FET and the impedance value of said load.

5. An attenuator according to claim 1, wherein said attenuator is operable over an operating frequency range including a passband covering the range 2.75 GHz to 5.25 GHz.

* * * * *